United States Patent [19]
Fang et al.

[11] Patent Number: 4,937,640
[45] Date of Patent: Jun. 26, 1990

[54] SHORT CHANNEL MOSFET

[75] Inventors: Frank F. Fang, Yorktown Heights; George A. Sai-Halasz, Mt. Kisco, both of N.Y.

[73] Assignee: International Business Machines Corporation, Armonk, N.Y.

[21] Appl. No.: 831,080

[22] Filed: Feb. 19, 1986

Related U.S. Application Data

[63] Continuation of Ser. No. 656,045, Sep. 28, 1984, abandoned, which is a continuation of Ser. No. 463,787, Feb. 4, 1983, abandoned, which is a continuation-in-part of Ser. No. 203,037, Nov. 3, 1980, abandoned.

[51] Int. Cl.$^5$ ............................................. H01L 29/78
[52] U.S. Cl. ..................................... 357/23.3; 357/23.7
[58] Field of Search ............................... 357/23.3, 23.7

[56] References Cited

U.S. PATENT DOCUMENTS

| | | | |
|---|---|---|---|
| 3,600,647 | 8/1971 | Gray | 317/235 |
| 3,840,886 | 10/1974 | Ashar et al. | 357/22 |
| 3,946,419 | 3/1976 | DeWitt et al. | 357/23 |
| 4,081,817 | 3/1978 | Hara | 357/23.3 |
| 4,091,405 | 5/1978 | Ishida | 357/23 |
| 4,132,998 | 1/1979 | Dingwall | 357/23.3 |
| 4,153,906 | 5/1979 | Shinoda et al. | 357/23.3 |
| 4,334,235 | 6/1982 | Hishizawa | 357/23.3 |
| 4,409,607 | 10/1983 | Rumennik | 357/23.3 |

FOREIGN PATENT DOCUMENTS 0051134 12/1982 European Pat. Off. .
54-136275 10/1979 Japan .................................. 357/23.3

OTHER PUBLICATIONS

Dang et al., IEEE J Solid State Circuits, vol. SC 15, No. 4, Aug. 1980, pp. 598–604.
Nishizawa et al., *ibid*, pp. 705–714.
Zuleeg et al., "A Thin-Film Space-Charge-Limited Triode", Proceedings of the IEEE, Sep. 1966, pp. 1197–1198.
Shur et al., "Ballistic Transport in Semiconductor . . . ", IEEE Transactions on Electron Devices, vol. ED-26, No. 11, Nov. 1979, pp. 1677–1683.
Barker et al., "On the Nature of Ballistic Transport . . . ", IEEE Electron Device Letters, vol. EDL-1, No. 10, Oct. 1980, pp. 209–210.

*Primary Examiner*—William D. Larkins
*Attorney, Agent, or Firm*—Alvin J. Riddles; John J. Goodwin

[57] ABSTRACT

A field effect transistor having operating characteristics based on the control and modulation of the punch through phenomenon. The channel region between the source and the drain regions is appropriately doped such that the source and drain depletion regions overlap when no potential is applied between source and drain. The overlapped region in the absence of a gate field has a potential barrier. A gate voltage modulates the barrier to below the kT/q parameter. The source-to-drain fields also modulate the barrier.

18 Claims, 1 Drawing Sheet

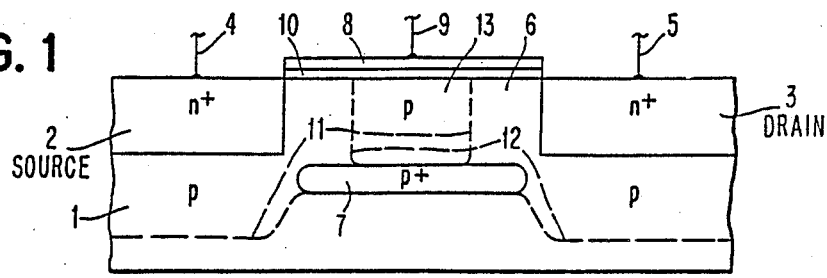
FIG. 1
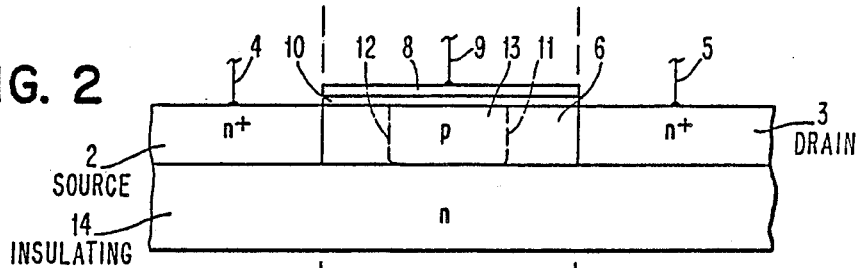
FIG. 2
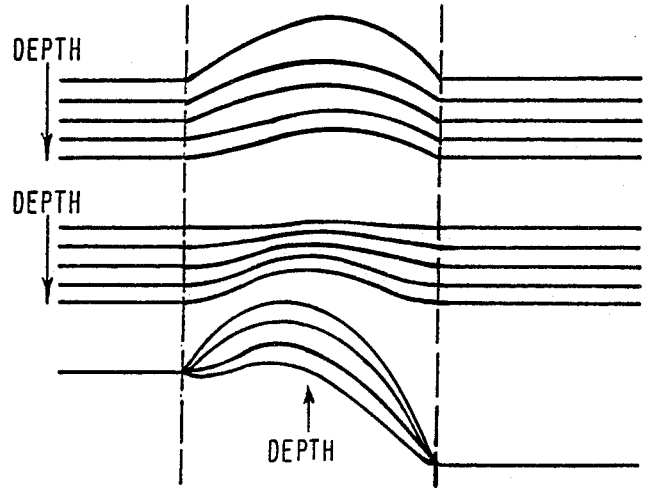
FIG. 3 NO BIAS
FIG. 4 GATE BIAS
FIG. 5 SOURCE-DRAIN BIAS
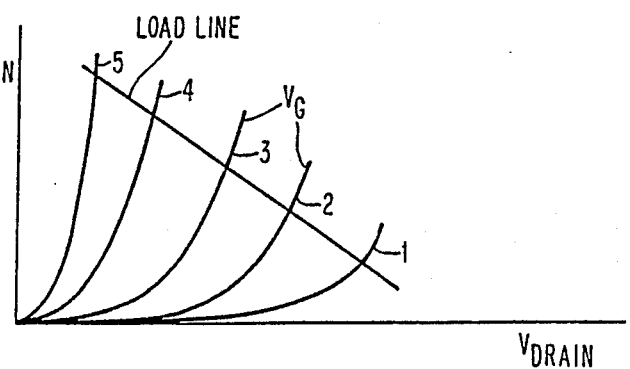
FIG. 6

SHORT CHANNEL MOSFET

This application is a continuation of application Ser. No. 06/656.045 filed Sept. 28, 1984, now abandoned which in turn is a continuation of application Ser. No. 96/463,787 filed Feb. 4, 1983, now abandoned, which in turn is a continuation-in-part of application Ser. No. 06/203,037 filed Nov. 3, 1980 now abandoned.

DESCRIPTION

1. Technical Field

The field of the invention is in very small dimension active semiconductor devices of the field effect transistor (FET) type wherein conduction occurs in a channel between source and drain electrodes under the influence of a signal applied to a gate positioned over the channel.

2. Background Art

One type of progress in both increased performance and in increased integrated circuit density in FET devices has been achieved by making the channel shorter. There is, however, a limitation to the ability to do this in that a depletion region is present in the semiconductor crystal adjacent to a heavily doped region such as the source and drain electrodes and when the channel length becomes as short as twice the width of that depletion region, the source and drain depletion regions touch and a condition known as punch through is established causing the device performance to be radically changed.

Generally, the depletion region width in moderate doping is in the order of thousands of angstroms, and for the material silicon using the modern electron beam lithography, for example, devices can be built with a channel length less than 1000Å so that punch through is now becoming a serious limiting factor.

U.S. Pat. Nos. 4,091,405 and 4,132,998 describe devices where, in order to get reduced channel lengths while avoiding punch through, heavy doping of the channel is employed.

BRIEF DESCRIPTION OF THE DRAWINGS

FIGS. 1 and 2 are cross-sectional views of a field effect transistor (FET) according to the invention.

FIGS. 3, 4 and 5 are dimensionally correlated graphical representations of electron energy distributions in the structure of an FET according to the invention.

FIG. 6 is a graphical representation of the current-potential output characteristics of the device of the invention.

DISCLOSURE OF THE INVENTION

The invention is a structure and operation of a field effect transistor in a modulated punch through mode so that response is achieved equivalent to shorter channel lengths than punch through will permit in ordinary operation and greater control of performance is achieved as a result of fields in the channel produced by both gate voltage and source to drain voltage.

In the device of the invention the depletion regions associated with the source and drain electrodes overlap over a region that is a significant portion of the channel length and a barrier present in the overlap region is changed in response to gate, source and drain potential levels. In the device of the invention, the source to drain current is in the bulk of the channel.

The structure of the invention differs from a standard FET by the fact that the depletion regions overlap in the channel to such an extent that there is a region that is a significant portion of the channel length in which a barrier can be modulated.

The structure of the invention is built so that the depletion regions associated with the source and drain regions overlap in an unbiased condition. Such a structure would be in a permanent punch through condition. While the position in the channel of an FET of the depletion region associated with the source and drain electrodes can be moved by the potential applied between source and drain, the use of such a potential introduces a threshold potential, results in higher potential levels and contributes to higher power dissipation, an important consideration in high density integrated circuits. The structure of the invention, by having the depletion regions overlap for a significant portion of the channel at no bias, avoids the excessive threshold.

The device is a solid state equivalent of a triode electron tube.

In accordance with the invention the overlapping depletion regions cover a significant portion of the channel and contain a barrier which can be modulated by a potential on the gate that operates to overcome that barrier in the overlapped depletion region. The gate potential polarity operates to overcome the barrier in the overlapped depletion region portion of the channel and by variation of source and drain voltage, differences are produced in the linear or longitudinal field in the channel which are available for control.

For a given gate voltage or potential, there exists a source-drain threshold voltage which can be referred to as $V_{TH}^d$, above which the source-drain conduction commences according to the space charge limited conditions. This $V_{TH}^d$ threshold voltage, as shown in FIG. 3, can be modulated by gate voltage as shown in FIG. 4 resulting in the device having $I_{drain}$-$V_{drain}$ performance characteristics as shown in FIG. 6. It is this $V_{TH}^d$ modulation by gate voltage $V_G$ that makes the device behave as described and makes it useful as an active switching element.

The structure of the invention is also preferably equipped with means to prevent parasitic current flow between the source and drain in parallel with the channel so that more positive modulation and the absence of a current between source and drain in the off condition is achieved.

BEST MODE FOR CARRYING OUT THE INVENTION

In order to provide one skilled in the art with a starting place in practicing the invention, consider the semiconductor material 1 to be silicon, and the polarity chosen for illustration is to be "n" for the source and drain regions and "p" for the channel, however, it will be apparent to one skilled in the art that other semiconductor materials and conductivity types may be employed.

For purposes of definition, the conductivity type n or p is the predominance of one type of carrier over another whereas the conductivity which is the reciprocal of the resistivity is a measure of the net doping density in the semiconductor.

Referring to FIG. 1 in a p conductivity type semiconductor material body 1, a source electrode region 2 and a drain electrode region 3 that are heavily doped and have high conductivity, shown as n+ are equipped with the external connections 4 and 5. The source 2 and drain 3 are separated by a channel 6. A parasitic current control, buried region 7, such as would be produced by ion p+, region 7, such as would be produced by ion implantation, is provided under the channel 6 and a gate 8 electrode with an external contact 9 is positioned in current flow influencing proximity over the channel 6 separated by an insulator 10. The semiconductor parameters of semiconductor material type, doping concentration and spacing of source to drain are maintained so that the depletion regions associated with the source and drain regions overlap for a significant portion of the channel when there is no potential applied between source and drain.

The overlap is shown in FIG. 1 as a dotted line 11 representing the extent of the depletion region associated with the source electrode 2 which is from the surface under the gate 8 to and along the region 7 and then further into the substrate essentially parallel to the source region 2. Similarly, the depletion region associated with the drain region 3 follows the same general path in the opposite direction as shown by the dotted line 12. The result is that a significant portion of the channel contains a barrier that can be modulated by a signal on the gate. The overlap region is labelled 13 in the channel 6. The boundaries 11 and 12 will be modified according to Poisson's equation and the potential inside the overlapping regions will be modified accordingly.

Referring to FIG. 2, an alternate structure is provided where the parasitic current control means is achieved by making the active device region an epitaxial film of, for example, silicon on an opposite conductivity type, high resistivity or insulating substrate 14 such as $Al_2O_3$ (sapphire). In the structure of FIG. 2 all other elements are as in FIG. 1 with the same reference numerals. The overlapping depletion region 11 extending from the source 2 and region 12 extending from the drain 3 are essentially along a vertical line from the gate 8 surface to the substrate interface with a slight curvature at the substrate interface.

The structures of FIGS. 1 and 2 are constructed so that the overlap region 13 is a significant portion of the channel length and is present at conditions of no bias between source and drain. The overlap region 13 is achieved as set forth in Expression 1 wherein the combined depletion regions associated with the source and drain electrodes is greater than half the channel length.

$$2\left(\frac{K_S \phi_b}{2\pi q N_a}\right)^{\frac{1}{2}} < L \text{ in } c\,g\,s \text{ units} \quad \text{Expression 1}$$

where
$\phi_b$ is the diffusion potential between the source 2 or drain 3 electrode and the region 7 or 14. For the material silicon this is about 1 volt.
L is the channel length between source 2 and drain 3.
$N_a$ is the doping density of the region 7 or 14, and
$K_S$ is the dielectric constant of the region 6.

Under conditions in the material silicon where the channel length L is 1 micrometer and the value of $N_a$ is $<5.3\times10^{15}$ per cm³ then the degree of overlapping will be how much $N_a$ is less than the value of expression 2.

$$N_a < 5.3 \times 10^7 \frac{\phi_b}{L} \text{ cm}^3 \quad \text{Expression 2}$$

where
$\phi_b$ is the diffusion potential defined previously.

In accordance with the invention where the overlap region is a significant portion of the channel length a barrier to carrier flow in the channel will be present and this barrier is responsive to a potential signal on the gate and a linear field between source and drain.

A positive potential applied to the gate 8 operates to reduce the height of the electron barrier in the overlap region 13. For p conductivity type in the channel 6 the gate voltage polarity would be positive (+). A variation in potential across the channel between source and drain changes the shape and distribution of the barrier. The performance of the device of the invention thus is controllable by both gate and source to drain signal levels.

Referring to FIGS. 3, 4 and 5, the barrier and the modulation thereof in accordance with the invention is illustrated. The FIGS. 3, 4 and 5 are dimensionally correlated with FIGS. 1 and 2, illustrating the relative potentials in the channel 6 and in the depletion region overlap 13. Each line is an equipotential line. Five are shown in essentially equal incremental distances with depth away from the gate 8.

FIG. 3 shows the barrier to electron current flow between source and drain in the overlap region 13. The preferred structure is to arrange the doping so that the overlap region is a significant portion of the order of one-fourth to all of the channel length under the conditions of no potential between source and drain.

A potential between source and drain will change the extent of the depletion regions 11 and 12 but due to the fact that the depletion regions are constructed to overlap of the order of one-fourth or greater of the channel at no potential between source and drain, there will be minimal threshold in the output characteristics.

The barrier in FIG. 3 increases from a level outside the overlap region 13 to a higher level in the region 13 to a lower level again outside the overlap region and is greater progressively farther from the heavily doped buried region 7 or the insulating substrate 14. The barrier is also affected by the work function of the gate 8 material. Where the gate material 8 is aluminum, a higher work function is present. The barrier height is determined by channel 6 length and doping.

In FIG. 4 an illustration is provided of the modulation of the barrier under the gate with constant source and drain signal levels.

In FIG. 4 a potential is applied to the gate 8 with respect to source 2 which operates to progressively reduce the barrier toward the gate and to permit current flow. In FIG. 4 for an illustrative value of gate voltage in one equipotential line adjacent the gate the barrier is removed. The barrier can be modulated to below the well known physical limitation $$\frac{kT}{q},$$

this value for the material silicon is about $26\times10^{-3}$ volts at room temperature.

It will be apparent to one skilled in the art that with sufficient signal strength on the gate 8 the entire barrier to current flow through the channel 6 can be removed and that the drain threshold voltage, which is the threshold voltage needed to turn on the device, decreases with gate voltage as shown in FIG. 6.

The device of the invention is also subject to control by a change in signal level at the source and drain 3. The change produces a different longitudinal or linear field in the channel region 6 and the field changes the barrier in the overlap region 13.

Referring to FIG. 5, the effect of the source to drain potential levels in the overlap region 13 of the channel 6 is shown. In this figure, for a given bias, a larger variation in barrier distortion is seen with greater distance from the gate interface. Other potentials between source and drain operate to introduce a threshold into the output characteristics.

The device of the invention is thus controllable both by gate voltage and by source to drain voltage.

It is seen from these figures that two limiting factors enter into the current flow under the conditions described. Namely, the emission limited current and space charge limited current in the channel 6 and near the gate 8 interface, respectively. The emission limited current is a strong function of the barrier height, $\phi_B$, varying $\sim \exp(-\phi_B kT)$. As $\phi_B/kT$ decreases due to the applied gate or drain potentials, space charge in the channel will limit the current. The space charge limited current i is a strong function of the drain voltage $V_d$ and the channel length L in the case of scattering limited as shown in Expression 3

Expression 3  $i \sim V_d^2/L^3$  and as shown in Expression 4

Expression 4  $i \sim V_d^3/L^2$ in the case of ballistic transport for an extremely short channel where channel length is smaller than the mean free path of an electron in the channel 6.

In order to provide a starting place for one skilled in the art to practice the invention, the following example specifications for the structure of FIG. 1 are set forth.

| Semiconductor 1 | silicon |
|---|---|
| Source 2 and Drain 3 | n+ doped to $10^{20}$/cc |
| Channel 6 | p doped to 2 × $10^{15}$/cc |
| Region 7 | p+ doped to $10^{18}$/cc |
| Space Charge Overlap | about 0.82 μm long |
| Region 13 | out of an approx. 1 μm channel. |

The potential barrier in the overlap region 13 is described by Expression 5.

$$\phi_b \simeq \frac{2\pi q\,(\tfrac{1}{2}N_a)(\tfrac{1}{2}L)^2}{K_S} \simeq 0.188 \text{ volt} \qquad \text{Expression 5}$$

Since the thermal energy $$\frac{kT}{q}$$

is 0.026 electron volts at room temperature, the barrier $\phi_b$ in region 13 is sufficient to prevent substantial thermionic emission from the source 2 over the barrier.

A new class of device is realized. The transfer I–V characteristics are shown schematically in FIG. 6. The device of the invention has considerably larger current gain than a conventional inversion layer FET, especially for a small channel length owing to its larger channel depth and higher electron mobility in the bulk.

Referring to FIG. 6, the drain current is the ordinate and the drain voltage is the abscissa. A conventional load line is shown with the curves representing performance at progressively larger values of gate voltage with the device being off at value 1. The parasitic current control means, the buried region 7 of FIG. 1 and the insulating substrate of FIG. 2 operate to keep the drain current "off," otherwise all the $V_G$ curves of FIG. 6 would converge on some finite current representing the parasitic current rather than on the V drain axis.

What has been described is a field effect transistor that operates by modulating a punch through condition.

Having thus described our invention, what we claim as new and desired to secure by Letters Patent is:

1. In a field effect transistor of the type wherein in a semiconductor body current conduction occurs in a channel region of said body between a source and a drain external electrodes and is modulated by a signal applied to a gate electrode positioned in current flow influencing proximity to said channel, the improvement comprising in combination overlapping depletion regions in said channel extending from said source electrode greater than the midpoint of the said channel toward said drain electrode but less than the entire distance to said drain electrode and extending from said drain electrode greater than the midpoint of the channel toward said source electrode but less than the entire distance to said source electrode and parasitic current control means positioned along said channel opposite to said gate and extending into proximity of said source and said drain electrodes.

2. The improvement of claim 1 wherein said physical distance is at least one-fourth of the length of said channel.

3. The structure of claim 1 wherein said parasitic current control means is a buried high conductivity region of opposite conductivity type with respect to said source and said drain under said channel.

4. The structure of claim 1 wherein said parasitic current control means is an essentially insulating substrate epitaxial with said channel and said source and drain electrodes.

5. A punch through modulated semiconductor device comprising in combination a semiconductor crystal body of a first conductivity type having spaced higher conductivity opposite conductivity type source and drain electrode regions separated by a channel region, said channel region conductivity and spacing producing at a condition of no source to drain potential overlapping depletion regions, the depletion region associated with said source electrode extending from said source electrode beyond the midpoint of said channel but less than the entire distance to said drain electrode and the depletion region associated with said drain electrode extending from said drain electrode beyond the midpoint of said channel but less than the entire distance to said source electrode and parasitic current control means operable to prevent parasitic current from flowing in said body adjacent and parallel to said channel.

6. The device of claim 5 wherein said overlapping region is from one-fourth to all of the distance between said source and drain electrodes.

7. The device of claim 5 wherein said parasitic current control means is a buried high conductivity same conductivity type region under said channel.

8. The device of claim 5 wherein said parasitic current control means is an essentially insulating substrate epitaxial with said channel and said source and drain regions.

9. In a field effect transistor of the type wherein current in a semiconductor material channel region between source and drain electrodes is modulated by a signal on a gate electrode positioned over said channel region, the improvement comprising
- an overlapping region of the respective depletion regions associated with said source and said drain electrodes
- said overlapping region occupying at least one-fourth but less than the total length of said channel and
- a parasitic current control means essentially coextensive with said gate and operable to prevent source to drain current flow in parallel with said channel.

10. The field effect transistor of claim 9 wherein said parasitic current control means is a buried region on the side of said channel opposite said gate and essentially coextensive with said gate of the same conductivity type but higher conductivity than said channel.

11. The field effect transistor of claim 9 wherein said parasitic current control means is an insulating substrate epitaxial with said channel and said source and drain regions.

12. The transistor of claim 10 wherein said semiconductor is silicon, said source and said drain are doped n to $10^{20}$/cc, said channel is doped p to $2 \times 10^{15}$/cc, said buried region is doped p+ to $10^{18}$/cc and the length of said channel is 1 micrometer.

13. A signal translating device comprising in combination
- a monocrystalline semiconductor body water,
- a first high conductivity electrode member at a first location in said semiconductor member,
- a second high conductivity electrode member at a second location in said semiconductor member, said second location being separated by a distance from said first location,
- said semiconductor body member being doped such that, under conditions of no potential being applied to said semiconductor body member, a space charge from each of said first and said second high conductivity electrodes, extends into said separation distance between said first and second high conductivity electrodes, toward the other of said electrodes a space charge extent distance that is operable to produce in said separation distance a region, of the order of one-fourth said separation distance, and less than the entire separation distance, in which there is carrier depletion influence from the space charge of both electrodes, and
- signal input electrode means insulated from and in current influencing proximity to the portion of said semiconductor body member between said first and said second high conductivity electrodes.

14. The device of claim 13 including parasitic current control means at least coextensive with said signal input electrode means and positioned to confine carrier flow in said semiconductor member to the portion between said high conductivity electrodes adjacent said signal input electrode.

15. The device of claim 14 wherein said control means for parasitic current is a buried high conductivity member of opposite conductivity type to the conductivity type of said first and second high conductivity electrode members and positioned under said semiconductor member opposite said signal input electrode.

16. The device of claim 14 wherein said control means for parasitic current is an essentially insulating substrate epitaxial with said semiconductor member opposite said signal input electrode.

17. The device of claim 15 wherein the semiconductor material of said semiconductor member is silicon of p conductivity type doped so $2 \times 10^{15}$/cc, said first and second high conductivity electrode members are of n conductivity type doped to $10^{20}$/cc, said buried member is of p+ conductivity type doped to $10^{18}$/cc and the separation distance between said first and second high conductivity electrode members is 1 micrometer.

18. The device of claim 16 wherein the semiconductor material of said semiconductor member is silicon of p conductivity type doped to $2 \times 10^{15}$/cc, said first and second high conductivity electrode members are of n conductivity type doped to $10^{20}$/cc, and the separation distance between said first and second high conductivity electrode members is 1 micrometer.

* * * * *